(12) United States Patent
Kume et al.

(10) Patent No.: US 11,960,208 B2
(45) Date of Patent: Apr. 16, 2024

(54) PHOTOSENSITIVE ELEMENT, RESIN COMPOSITION FOR FORMING BARRIER LAYER, METHOD FOR FORMING RESIST PATTERN, AND METHOD FOR MANUFACTURING PRINTED WIRING BOARD

(71) Applicant: Showa Denko Materials Co., Ltd., Tokyo (JP)

(72) Inventors: Masakazu Kume, Tokyo (JP); Hiroshi Ono, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 722 days.

(21) Appl. No.: 17/053,266

(22) PCT Filed: May 8, 2019

(86) PCT No.: PCT/JP2019/018441
§ 371 (c)(1),
(2) Date: Nov. 5, 2020

(87) PCT Pub. No.: WO2019/216353
PCT Pub. Date: Nov. 14, 2019

(65) Prior Publication Data
US 2021/0286265 A1    Sep. 16, 2021

(30) Foreign Application Priority Data
May 9, 2018 (WO) .................. PCT/JP2018/017958

(51) Int. Cl.
*G03F 7/09* (2006.01)
*G03F 7/038* (2006.01)
*G03F 7/11* (2006.01)
*G03F 7/26* (2006.01)
*H05K 1/03* (2006.01)

(52) U.S. Cl.
CPC ............ *G03F 7/091* (2013.01); *G03F 7/0382* (2013.01); *G03F 7/11* (2013.01); *G03F 7/26* (2013.01); *H05K 1/036* (2013.01); *H05K 1/0373* (2013.01)

(58) Field of Classification Search
CPC .................................. G03F 7/091; G03F 7/11
See application file for complete search history.

(56) References Cited

U.S. PATENT DOCUMENTS

2005/0238996 A1* 10/2005 Wada ...................... G03F 7/202
                                                                 430/270.1
2019/0006295 A1*  1/2019 Tadano .................. H01L 21/78

FOREIGN PATENT DOCUMENTS

| JP | 07026175 A | * | 1/1995 |
| JP | H9-236915 A | | 9/1997 |
| JP | 2003-524212 A | | 8/2003 |
| JP | 2004-101751 A | | 4/2004 |

(Continued)

OTHER PUBLICATIONS

Machine translation of JP 07-026175 (no date).*
Machine translation of written opinion (ETWOS( (no date) (Year: 000).*

*Primary Examiner* — Amanda C. Walke
(74) *Attorney, Agent, or Firm* — FITCH, EVEN, TABIN & FLANNERY, LLP

(57) ABSTRACT

A photosensitive element comprising a support film, a barrier layer, and a photosensitive layer in this order, wherein the barrier layer contains a water-soluble resin and an ultraviolet absorber.

13 Claims, 2 Drawing Sheets

(56) References Cited

FOREIGN PATENT DOCUMENTS

| JP | 2004-325513 A | 11/2004 | |
|----|---------------|---------|---|
| JP | 2006-085116 A | 3/2006 | |
| JP | 2013-024913 A | 2/2013 | |
| JP | 5483734 B | 5/2014 | |
| JP | 5551255 B | 7/2014 | |
| KR | 10-2007-0051335 A | 5/2007 | |
| TW | 377366 B | 12/1999 | |
| TW | I297809 B | 6/2008 | |
| WO | WO-2012099007 A1 * | 7/2012 | ......... B29C 65/1406 |
| WO | 2018/070523 A1 | 4/2018 | |

* cited by examiner

PHOTOSENSITIVE ELEMENT, RESIN COMPOSITION FOR FORMING BARRIER LAYER, METHOD FOR FORMING RESIST PATTERN, AND METHOD FOR MANUFACTURING PRINTED WIRING BOARD

CROSS-REFERENCE TO RELATED APPLICATIONS

This application is a U.S. national phase application filed under 35 U.S.C. § 371 of International Application No. PCT/JP2019/018441, filed May 8, 2019, designating the United States, which claims priority from International Application No. PCT/JP2018/017958, filed May 9, 2018, which are hereby incorporated herein by reference in their entirety.

TECHNICAL FIELD

The present disclosure relates to a photosensitive element, a resin composition for forming a barrier layer, a method for forming a resist pattern, and a method for producing a printed wiring board.

BACKGROUND ART

Conventionally, in the field of production of printed wiring boards, photosensitive resin compositions, and photosensitive elements including layers formed on support films using photosensitive resin compositions (hereinafter, also referred to as "photosensitive layer") have been widely used as resist materials used in etching or plating.

The printed wiring board is produced using the photosensitive element by the following procedure. Namely, first, the photosensitive layer of the photosensitive element is laminated on a substrate for forming a circuit, such as a copper-clad laminate. At this time, lamination is performed such that the surface of the photosensitive layer opposite to the surface contacting the support film adheres to the surface forming a circuit on the substrate for forming a circuit. Moreover, lamination is performed, for example, by thermally press bonding the photosensitive layer onto the substrate for forming a circuit (normal pressure lamination method).

Next, radicals are generated by exposing desired regions of the photosensitive layer using a mask film or the like through the support film. The generated radicals pass through some reaction paths, and contribute to the cross-linking reaction (photocuring reaction) of a photopolymerizable compound. Subsequently, after the support film is peeled off, uncured portions of the photosensitive layer are dissolved or dispersed with a developing solution to be removed, forming a resist pattern. Next, the resist pattern is used as a resist, and etching or plating is performed to form a conductive pattern; the photocured portions (resist pattern) of the photosensitive layer is finally peeled off (removed).

Meanwhile, in recent years, a method of forming an excellent resist pattern by exposing a photosensitive layer after peeling off a support film prior to exposure has been studied. However, in the case of exposing the photosensitive layer after peeling off the support film, generated radicals are brought into contact with oxygen in the air, such that the radicals are stabilized rapidly (deactivated), and a photocuring reaction of a photopolymerizable compound hardly proceeds. For this reason, in this method, to reduce the influences accompanied by mixing of oxygen in the case where the support film is peeled off and exposure is performed, use of a photosensitive element including a barrier layer (an intermediate layer) having gas barrier properties and disposed between the support film and the photosensitive layer has been examined (for example, see Patent Literatures 1 to 3).

CITATION LIST

Patent Literature

Patent Literature 1: Japanese Patent No. 5483734
Patent Literature 2: Japanese Unexamined Patent Publication No. 2013-24913
Patent Literature 3: Japanese Patent No. 5551255

SUMMARY OF INVENTION

Technical Problem

For achieving a high resolution, an exposure system using a projecting exposing apparatus has been used as an exposure method. This exposure system is a method by which active light beams projecting the image of a photo mask radiate through a lens to form the image. The exposure system using a projecting exposing apparatus can also be applied to a photosensitive element provided with a barrier layer containing a water-soluble resin as described in Patent Literature 1 to 3 above. However, since a projecting exposing apparatus generally uses a high-light intensity lamp, there is a drawback that it is difficult to achieve high resolution without decreasing the sensitivity of a photosensitive layer to be exposed. This is conceivably because when the sensitivity of a photosensitive layer is too high, excessive radicals are generated by exposure which tends to shorten the molecular chain length of a cured product, and such a cured product disperses easily in the developing solution.

As the method for reducing the sensitivity of a photosensitive layer, a method of increasing the amount of a reaction inhibitor such as a polymerization inhibitor added to a photosensitive layer, or reducing the amount of a photopolymerization initiator or a photosensitizer added to a photosensitive layer has been reported.

However, since a polymerization inhibitor that has a high capacity to improve the resolution generally contains a large amount of low molecular weight components and tends to volatilize in a drying step at the time of producing a photosensitive element, it is difficult to obtain stable sensitivity by a method of increasing the amount of a polymerization inhibitor. Meanwhile, in a method of reducing the amount of a photopolymerization initiator component and the like, or the like, deterioration of the resist shape formed after patterning and a change in the amount of residue at the resist bottom occur, and therefore there is a drawback of difficult adjustment.

The present disclosure has been made in view of the problems of the conventional technology with an object to provide a photosensitive element, a resin composition for forming a barrier layer, a method for forming a resist pattern, and a method for producing a printed wiring board that can moderately reduce the sensitivity without increasing the amount of a polymerization inhibitor, or reducing the amount of a photopolymerization initiator, and improve the resolution.

Solution to Problem

In order to achieve the above object, the present disclosure provides a photosensitive element comprising a support film, a barrier layer, and a photosensitive layer in this order, wherein the barrier layer in the photosensitive element contains a water-soluble resin and an ultraviolet absorber.

The photosensitive element of the present disclosure is capable of moderately reducing the sensitivity without increasing the amount of a polymerization inhibitor, or reducing the amount of a photopolymerization initiator, and improve the resolution when its barrier layer contains an ultraviolet absorber. With such a photosensitive element, even when a projecting exposing apparatus with high light intensity is used, exposure with the optimal sensitivity is possible, and therefore the reduction in resolution can be suppressed. Further, the sensitivity instability of the photosensitive element can be suppressed, because the resolution can be improved without increasing the amount of a polymerization inhibitor used. Therefore, it may be also said that a resist pattern superior in resolution can be formed by use of a photosensitive element of the present disclosure.

In the photosensitive element of the present disclosure, the ultraviolet absorber may include a benzophenone sulfonic acid compound, or a compound represented by the following formula (1). With such a photosensitive element, the resolution can be improved.

[Chemical Formula 1]

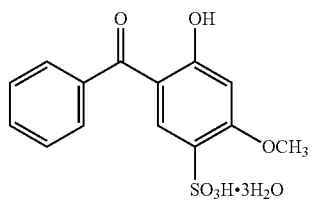

(1)

In the photosensitive element of the present disclosure, the solubility of the ultraviolet absorber in water at 20° C. may be 0.1 g/100 mL-$H_2O$ or more. With such a photosensitive element, generation of an aggregate or a precipitate in the barrier layer can be further suppressed, and a photosensitive element superior in practical performance can be provided.

In the photosensitive element of the present disclosure, the content of the ultraviolet absorber in the barrier layer may be more than 0% by mass and 10.0% by mass or less based on the total amount of the barrier layer.

In the photosensitive element of the present disclosure, the ultraviolet absorptance of the barrier layer may be from 5 to 95%.

In the photosensitive element of the present disclosure, the water-soluble resin may contain polyvinyl alcohol. With such a photosensitive element, the gas barrier property of the barrier layer can be improved and deactivation of radicals generated by active light beams used for exposure can be better suppressed.

In the photosensitive element of the present disclosure, the support film may be a polyester film. With such a photosensitive element, the mechanical strength and resistance to heat of the support film may be improved, and also defects, such as wrinkles of a barrier layer, which may be generated when the barrier layer is formed on the support film may be suppressed in such a way as to improve the workability.

The present disclosure also provides a resin composition for forming a barrier layer, comprising a water-soluble resin, an ultraviolet absorber, and water.

In a resin composition for forming a barrier layer of the present disclosure, the ultraviolet absorber may contain a benzophenone sulfonic acid compound, or contain a compound represented by the following formula (1). With such a resin composition for forming a barrier layer, the resolution can be more improved.

[Chemical Formula 2]

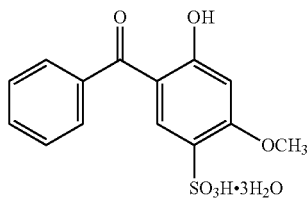

(1)

In a resin composition for forming a barrier layer of the present disclosure, the solubility of the ultraviolet absorber in water at 20° C. may be 0.1 g/100 mL-$H_2O$ or more. With such a resin composition for forming a barrier layer, generation of an aggregate or a precipitate in a barrier layer to be formed can be further suppressed, and a barrier layer superior in practical performance can be formed.

In a resin composition for forming a barrier layer of the present disclosure, the content of the ultraviolet absorber may be from 0.1 to 10.0 parts by mass per 500 parts by mass of the water.

With respect to a resin composition for forming a barrier layer of the present disclosure, the ultraviolet absorptance of a 5 μm-thick dry film formed of the resin composition may be from 5 to 95%.

In a resin composition for forming a barrier layer of the present disclosure, the water-soluble resin may contain polyvinyl alcohol. With such a resin composition for forming a barrier layer, a barrier layer superior in gas barrier property can be formed.

The present disclosure also provides a method for forming a resist pattern comprising a step of disposing a photosensitive layer, a barrier layer, and a support film on a substrate in this order from the substrate side using the photosensitive element of the present disclosure; a step of removing the support film and exposing the photosensitive layer to active light beams through the barrier layer; and a step of removing uncured portions of the photosensitive layer and the barrier layer from the substrate. By such a method of forming a resist pattern, since a resist pattern is formed using a photosensitive element of the present disclosure, a resist pattern superior in resolution can be formed.

The present disclosure further provides a method for producing a printed wiring board comprising a step of forming a conductive pattern by subjecting a substrate, on which a resist pattern has been formed by the method for forming a resist pattern according to the present disclosure, to etching or plating. By such a method of producing a printed wiring board, since a resist pattern is formed by the aforementioned method of forming a resist pattern of the present disclosure, a resist pattern superior in resolution can be formed, and consequently a method for producing a printed wiring board suitable for a printed wiring board with a higher density can be provided.

Advantageous Effects of Invention

The present disclosure can provide a photosensitive element, a resin composition for forming a barrier layer, a method for forming a resist pattern, and a method for producing a printed wiring board that can moderately reduce the sensitivity without increasing the amount of a polymerization inhibitor, or reducing the amount of a photopolymerization initiator, and improve the resolution.

DESCRIPTION OF EMBODIMENTS

Hereinafter, suitable embodiments of the present disclosure will be described in detail when necessary with reference to the drawings. In the following embodiments, it is needless to say that their components (also including steps) are not always essential unless otherwise specified and unless it is believed that these are clearly essential in principle. The same is applied to numeric values and ranges, which should be construed not to unreasonably limit the present disclosure.

In this specification, (meth)acrylic acid means at least one of acrylic acid and corresponding methacrylic acid. Moreover, the same is applied to other similar terms such as (meth)acrylate. The materials presented below as examples may be used singly or in combination of two or more thereof, unless otherwise stated. When a plurality of substances exist corresponding to each component in the composition, the content of each component in a composition means, unless otherwise specified, the total amount of the plurality of substances existing in the composition.

Moreover, in this specification, the term "step" includes not only independent steps but also steps which cannot be clearly distinguished from other steps but achieve expected actions of the steps.

Furthermore, in this specification, numeric value ranges expressed with "to" indicate ranges including the numeric values before and after "to" as the minimum value and the maximum value. Moreover, in the numeric value ranges described in stepwise manners in this specification, the upper limit value or lower limit value of a numeric value range at one level may be replaced with the upper limit value or lower limit value of a numeric value range at another level. Moreover, in the numeric value ranges described in this specification, the upper limit values or lower limit values of the numeric value ranges may be replaced with the values shown in Examples. Moreover, in this specification, the term "layer" involves a structure of a shape formed across an entire surface as well as a structure of a shape partially formed when observed in plan views.

[Photosensitive Element]

Figure 1:
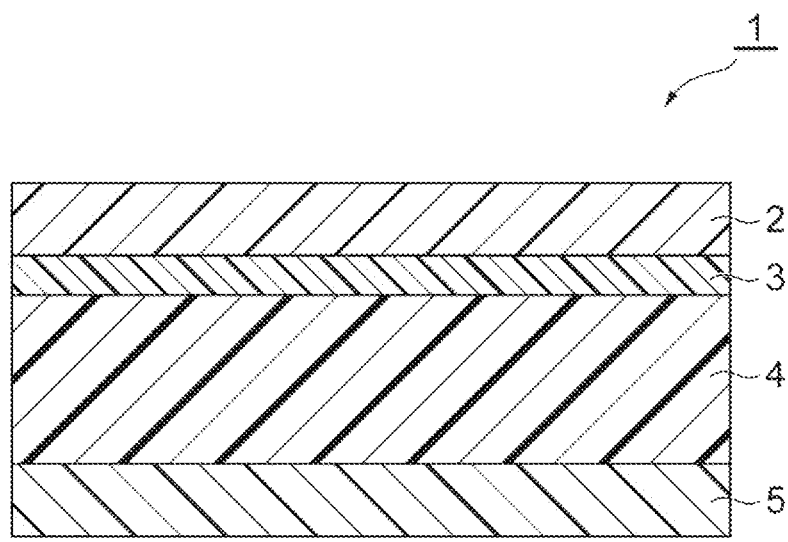
FIG. 1 is a schematic sectional view illustrating one embodiment of the photosensitive element according to the present disclosure.

As illustrated in FIG. 1, a photosensitive element 1 according to the present embodiment includes a support film 2, a barrier layer 3, and a photosensitive layer 4 in this order, and may further include other layers such as a protective layer 5. The barrier layer contains a water-soluble resin and an ultraviolet absorber. By using the photosensitive element of this embodiment, the barrier layer absorbs the exposure light beam so as to improve the resolution through optimization of the sensitivity, and therefore superior practical performance can be developed. Hereinafter, the layers of the photosensitive element according to the present embodiment will be described in detail.

<Support Film>

A support film of the present embodiment may be used without particular limitation. Examples thereof include a film of polyester, such as poly(ethylene terephthalate) (PET), poly(butylene terephthalate) (PBT) and polyethylene-2,6-naphthalate (PEN), and a film of polyolefin, such as polypropylene and polyethylene. Among others, a polyester film may be used. By using a polyester film as a support film, the mechanical strength and heat resistance of the support film tend to be improved. Further, by using a polyester film, a defect such as wrinkles of a barrier layer to be generated in forming a barrier layer on a support film tends to be suppressed in such a way as to improve the workability. From the viewpoint of suppressing generation of minute defective parts in a resist pattern, a polyester film containing particles (lubricant, etc.) may be used. When a polyester film containing particles (lubricant, etc.) is used, a barrier layer may be formed on a surface on the side where particles (lubricant, etc.) are present. As such a polyester film, for example, a polyester film kneaded with particles (lubricant, etc.), a polyester film having formed layers containing particles (lubricant, etc.) on both sides, or a polyester film having formed a layer containing particles (lubricant, etc.) on one side may be used. In this regard, a support film may be constituted with a single layer or multiple layers.

Examples of a method of adding particles such as a lubricant to a support film include a method of kneading particles (lubricant, etc.) into a support film, and a method of forming a layer containing particles (lubricant, etc.) on a support film using a method known in the art, such as roll coating, flow coating, spray coating, curtain flow coating, dip coating, and slit die coating.

The haze of the support film may be 0.01 to 5.0%, 0.01 to 1.5%, 0.01 to 1.0%, or 0.01 to 0.5%. When the haze is 0.01% or more, a support film itself tends to be produced more easily; and when it is 5.0% or less, a foreign matter in a photosensitive layer tends to be detected more easily in forming a photosensitive layer of a photosensitive element. In this regard, "haze" means cloudiness. A haze in the present disclosure means a value measured using a commercially available haze meter (turbidity meter) according to the method provided in JIS K 7105. A haze can be measured, for example, with a commercially-supplied turbidity meter, such as NDH-5000 (trade name, manufactured by Nippon Denshoku Industries Co., Ltd.).

As a support film, a film, which can be used as a support film of a photosensitive element among commercially available general purpose industrial films, may be procured and used after an appropriate processing. Specific examples thereof include a PET film, such as "FB-40" (product name, manufactured by Toray Industries, Inc.), "A4100", and "A1517" (product names, manufactured by Toyobo Co., Ltd.), and "G2H" (product name, manufactured by Teijin DuPont Film Co., Ltd.).

The thickness of a support film may be from 1 to 200 μm, from 1 to 100 μm, from 1 to 60 μm, from 5 to 60 μm, from 10 to 60 μm, from 10 to 50 μm, from 10 to 40 μm, from 10 to 30 μm, or from 10 to 25 μm. When the thickness of a support film is 1 μm or more, breakage of the support film in peeling the support film tends to be suppressed. When the thickness of a support film is 200 μm or less, economic benefits tend to be obtained more easily.

<Barrier Layer>

A photosensitive element of the present embodiment comprises a barrier layer between a support film and a photosensitive layer. The barrier layer contains a water-soluble resin and an ultraviolet absorber. With a photosensitive element of this embodiment, even when the amount of polymerization inhibitor added in the photosensitive layer is not increased, the barrier layer absorbs exposure light beams to achieve optimum sensitivity, so that deterioration of the resolution of a resist pattern, which is formed by exposing the photosensitive layer through the barrier layer after removing the support film, can be suppressed. The barrier layer may be a layer formed using the resin composition for forming a barrier layer of this embodiment described below. The resin composition for forming a barrier layer of this embodiment contains a water-soluble resin, an ultraviolet absorber, and water. Further, the barrier layer may have water solubility, and may have solubility in a developing solution. Meanwhile, from the viewpoint of further improvement of the gas barrier property of the barrier layer, the adhesive force between the support film and the barrier layer may be lower than the adhesive force between the barrier layer and the photosensitive layer. In other words, when the support film is peeled off from the photosensitive element, unintentional peeling of the barrier layer from the photosensitive layer is suppressed.

(Water-Soluble Resin)

"Water-soluble resin" means a resin having a solubility of 5 g/100 mL-$C_6H_{14}$ or less in 100 mL of hexane at 25° C. This solubility can be determined by mixing hexane at 25° C. and a dried water-soluble resin and examining the presence or absence of whity turbidness. Specifically, sample 1 obtained by placing a mixed liquid of A (g) of a dried water-soluble resin and 100 mL of hexane in a colorless transparent glass container with a ground glass stopper, and Sample 2 obtained by placing only 100 mL of hexane in another colorless transparent glass container with a ground glass stopper are prepared respectively. Then the samples in the glass containers are shaken thoroughly and left until it is confirmed that bubbles have disappeared. Immediately after the confirmation both the containers are placed side by side in diffused daylight or equivalent light, and the condition of the liquid of the sample 1 and the condition of the liquid of the sample 2 are compared. Through the comparison between the sample 1 and the sample 2, the addition amount A (g) at a time point, where it is observed that the sample 1 starts to become more cloudy, or a solid content starts to float, is defined as the solubility of the water-soluble resin in 100 mL of hexane at 25° C.

Examples of the water-soluble resin include polyvinyl alcohol, polyvinylpyrrolidone, and water-soluble polyimides. From the viewpoint of further improvement of the gas barrier property of the barrier layer and further suppression of deactivation of radicals generated by active light beams used for exposure, the water-soluble resin may contain polyvinyl alcohol. Polyvinyl alcohol can be obtained, for example, by saponifying polyvinyl acetate obtained through polymerization of vinyl acetate. The degree of saponification of polyvinyl alcohol used in the present embodiment may be 50 mol % or more, 70 mol % or more, or 80 mol % or more. The upper limit of such degree of saponification is 100 mol %. If a polyvinyl alcohol having a degree of saponification of 50 mol % or more is contained, the gas barrier properties of the barrier layer tend to be further improved, and the resolution of the resist pattern to be formed tends to be further improved. The "degree of saponification" in this specification indicates the value measured according to JIS K 6726 (1994) (Polyvinyl Alcohol Test Method) specified in Japanese Industrial Standards.

Two or more of the polyvinyl alcohols having different degrees of saponification, viscosities, degrees of polymerization, modification types, etc. may be used in combination. The average polymerization degree of polyvinyl alcohol may be 300 to 5000, 300 to 3500, or 300 to 2000. The water-soluble resins may be used singly or in combinations of two or more. The water-soluble resin may include, for example, polyvinyl alcohol and polyvinylpyrrolidone. In this case, the mass ratio (PVA:PVP) of polyvinyl alcohol to polyvinylpyrrolidone may be from 40:60 to 90:10, from 50:50 to 90:10, or from 60:40 to 90:10.

The content of the water-soluble resin in the resin composition for forming a barrier layer of the present Embodiment may be from 50 to 300 parts by mass, from 60 to 250 parts by mass, from 70 to 200 parts by mass, from 80 to 150 parts by mass, or from 80 to 125 parts by mass with respect to 500 parts by mass of water from the viewpoint of improvement of gas barrier properties.

(Ultraviolet Absorber)

An ultraviolet absorber (UV absorber) is a compound having an optical absorption band in a wavelength range of 300 nm to 400 nm. An ultraviolet absorber may be also water-soluble. An ultraviolet absorber may have a maximum absorption wavelength in a wavelength range of 250 nm to 500 nm from the viewpoint of more improving the resolution. When an ultraviolet absorber is contained, the resolution can be improved.

The i-ray absorptance of an ultraviolet absorber may be from 5 to 95%, from 10 to 90%, or from 15 to 75%. An i-ray absorptance can be measured by a ultraviolet-visible spectrophotometer.

The ultraviolet absorbers may be used singly or in combination of two or more thereof. The solubility in water at 20° C. may be 0.01 g/100 mL-$H_2O$ or more, 0.1 g/100 mL-$H_2O$ or more, or 1 g/100 mL-$H_2O$ or more from the viewpoint of suppressing aggregation or precipitation of the ultraviolet absorber in a barrier layer.

Examples of an ultraviolet absorber include an oxybenzophenone compound, a triazole compound, a benzotriazole compound, a salicylic ester compound, a benzophenone compound, a diphenyl acrylate compound, a cyanoacrylate compound, a diphenyl cyanoacrylate compound, an iron or nickel complex salt compound. Among these, an oxybenzophenone compound, and a benzophenone compound are preferable from the viewpoint of more improving the resolution; a benzophenone sulfonic acid compound is more preferable; and an oxybenzophenone sulfonic acid compound is further preferable. In this regard, a "benzophenone sulfonic acid compound" is a compound in which a benzophenone compound has a sulfo group, and the benzophenone sulfonic acid compound may be a hydrate. Presumably, in these compounds, since there is a hydrophilic sulfo group in the benzophenone skeleton, the benzophenone skeleton has a high affinity for a resist, while the sulfo group has a high affinity for the barrier layer, so that high resolution and easy removal of the barrier layer can be both attained. Among the oxybenzophenone compounds, 2-hydroxy-4-methoxybenzophenone-5-sulfonic acid hydrate represented by the following formula (1) is preferable.

[Chemical Formula 3]

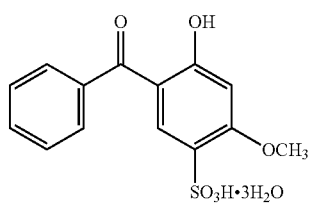

(1)

The content of an ultraviolet absorber in the resin composition for forming a barrier layer of this embodiment may be from 0.1 to 10.0 parts by mass, from 0.3 to 7.0 parts by mass, or from 0.5 to 4.0 parts by mass per 500 parts by mass of the water from the viewpoint of more improving the resolution. The lower the content of an ultraviolet absorber, the better the shape of the obtained resist pattern becomes. In particular, when the content of an ultraviolet absorber is 4.0 parts by mass or less per 500 parts by mass of water, a resist pattern superior in the resist pattern shape can be formed.

The content of an ultraviolet absorber in the barrier layer of this embodiment may be from the viewpoints of more improving the resist pattern shape as well as the resolution more than 0% by mass and 10.0% by mass or less, from 0.01 to 6.5% by mass, from 0.01 to 5.0% by mass, from 0.01 to 4.0% by mass, from 0.01 to 2.0% by mass, or from 0.05 to 1.5% by mass based on the total amount of the barrier layer (total solid content of the resin composition for forming a barrier layer to form the barrier layer). The lower the content of the ultraviolet absorber, the better the resist pattern shape of the obtained resist pattern becomes. In particular, when the content of the ultraviolet absorber is 0.5% by mass or less based on the total amount of the barrier layer, a resist pattern having a more improved resist pattern shape can be formed. Meanwhile, from the viewpoint of obtaining a better resolution, the content of the ultraviolet absorber may be 1.5% by mass or more, or 1.8% by mass or more based on the total amount of the barrier layer.

The barrier layer of this embodiment may have an absorbance with respect to the light with a wavelength of 365 nm from 0.01 to 2.0, or may be from 0.1 to 1.0. When the absorbance is 0.01 or more, a better resolution tends to be obtained, and when the absorbance is 2.0 or less, the resist pattern shape of the resulting resist pattern tends to be more improved. The absorbance of the barrier layer can be measured, for example, using a UV spectrophotometer (U-3310 spectrophotometer, manufactured by Hitachi, Ltd.). The measurement is performed by placing a laminated film in which a barrier layer having any thickness is formed on the measured side of a support film, and placing a support film on the reference side, and then continuously scanning over the wavelength of 300 to 700 nm in the absorbance mode, and reading the value at the wavelength of 365 nm.

(Other Component)

The resin composition for forming a barrier layer of this embodiment may contain an alcohol having 3 or more carbon atoms. A C3 or higher alcohol may be a monohydric alcohol or a polyhydric alcohol (excluding a plasticizer of a polyhydric alcohol compound described below). The C3 or higher alcohol may contain at least one selected from the group consisting of compounds represented by the following chemical formulas (2) to (4) and compounds represented by the following general formula (5). When any of the alcohols having 3 or more carbon atoms is contained, the peelability of a support film from a barrier layer can be improved. Therefore, when a support film is peeled from a photosensitive element, unintended peeling between the barrier layer and the photosensitive layer can be suppressed, and decrease in the gas barrier property, and decrease in resolution caused by such unintended peeling can be suppressed.

[Chemical Formula 4]

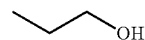

(2)

[Chemical Formula 5]

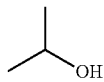

(3)

[Chemical Formula 6]

(4)

[Chemical Formula 7]

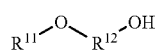

(5)

In general formula (5), $R^{11}$ represents an alkyl group, and $R^{12}$ represents an alkylene group. The sum of the numbers of carbon atoms of the group $R^{11}$ and the group $R^{12}$ is 3 or more. The sum of numbers of carbon atoms of the group $R^{11}$ and the group $R^{12}$ may be 10 or less, 8 or less, 7 or less, or 5 or less from the viewpoint of further improvement of the affinity with water. The alkyl group represented by $R^{11}$ may be a C1 to C4 alkyl group, and the alkylene group represented by $R^{12}$ may be a C1 to C3 alkylene group. The C3 or higher alcohol represented by general formula (5) may be also 2-butoxyethanol or 1-methoxy-2-propanol.

The C3 or higher alcohols may be used singly or in combinations of two or more. The solubility of the C3 or higher alcohol in water at 20° C. may be 300 mL/100 mL-$H_2O$ or more, 500 mL/100 mL-$H_2O$ or more, or 1000 mL/100 mL-$H_2O$ or more from the viewpoint of further suppression of layer separation of the barrier layer.

"The solubility of a C3 or higher alcohol in water at 20° C." in this specification is determined by mixing the alcohol with water at 20° C. and examining the presence or absence of whity turbidness. Specifically, sample 3 obtained by placing a mixed liquid of A mL of the alcohol and 100 mL of water in a colorless transparent glass container with a ground glass stopper, and Sample 4 obtained by placing only 100 mL of water in another colorless transparent glass container with a ground glass stopper are prepared respectively. Then the respective samples in the glass containers are shaken thoroughly and left until it is confirmed that bubbles have disappeared. Immediately after the confirmation both the containers are placed side by side in diffused daylight or equivalent light, and the condition of the liquid of the sample 3 and the condition of the liquid of the sample 4 are compared. Through the comparison between the sample 3 and the sample 4, the addition amount A mL of the alcohol at a time point, where it is observed that the sample 3 starts to become more cloudy, is defined as the solubility of the alcohol in water at 20° C.

The content of the C3 or higher alcohol in the resin composition for forming a barrier layer of the present embodiment may be from 100 to 500 parts by mass, or from 125 to 450 parts by mass with respect to 500 parts by mass of water. When the content is 100 parts by mass or more, the releasability between the barrier layer to be formed and a support film tends to be improved, and when it is 500 parts by mass or less, the solubility of the water-soluble resin is improved and the barrier layer tends to be formed more easily.

The content of the C3 or higher alcohol in the barrier layer of the present embodiment may be more than 0 mass % and 2.0 mass % or less, from 0.001 to 2.0 mass %, or from 0.005 to 1.0 mass % based on the total amount of the barrier layer (the total amount of the solid content of the resin composition for forming a barrier layer to form the barrier layer). When the content is 2.0 mass % or less, diffusion of an alcohol in a later step tends to be suppressed, when it is 0.001 mass % or more, the releasability between the barrier layer and the support film tends to be improved.

The resin composition for forming a barrier layer of the present embodiment may contain an alcohol having a number of carbon atoms of less than 3. When it contains the alcohol having a number of carbon atoms of less than 3, the content may be from 125 to 375 parts by mass, or from 150 to 325 parts by mass with respect to 500 parts by mass of water. When the content is 125 parts by mass or more, the solubility of the water-soluble resin is improved, and the barrier layer tends to be formed easily, and when the content is 375 parts by mass or less, the releasability between the barrier layer to be formed and the support film tends to be improved. From the viewpoint of improvement of the releasability between the barrier layer and the support film, the content of the alcohol having a number of carbon atoms of less than 3 in the barrier layer of the present embodiment may be from 0.1 to 10 mass % based on the total amount of alcohols having a number of carbon atoms of 3 or more in the barrier layer.

The resin composition for forming a barrier layer of the present embodiment may contain a publicly known additive, such as a plasticizer, and a surfactant, to the extent that the effect of the present disclosure is not hindered. Further, it may contain a release accelerator to the extent that the effect of the present disclosure is not hindered.

As the plasticizer, for example, a polyhydric alcohol compound may be contained from the viewpoint of improvement of stretchability. Examples thereof include glycerols such as glycerol, diglycerol, and triglycerol; alkylene glycols such as ethylene glycol, diethylene glycol, triethylene glycol, tetraethylene glycol, polyethylene glycol, propylene glycol, dipropylene glycol, and polypropylene glycol; (poly)alkylene glycols, and trimethylolpropane. These plasticizers may be used alone or in combinations of two or more.

With respect to the resin composition for forming a barrier layer of this embodiment, the ultraviolet absorptance of a 5 μm-thick dry film formed of the resin composition may be 5 to 95%, 10 to 90%, or 15 to 75% from the viewpoint of moderately reducing the sensitivity of the photosensitive layer to be exposed and improving the resolution. The ultraviolet absorptance of the dry film can be measured by a ultraviolet-visible spectrophotometer.

The barrier layer in the photosensitive element of the present Embodiment can be formed, for example, by coating the resin composition for forming a barrier layer of the present embodiment on the support film, and drying the same.

There is no particular restriction on the thickness of the barrier layer. The thickness of the barrier layer may be 12 μm or less, 10 μm or less, 8 μm or less, 7 μm or less, or 6 μm or less from the viewpoint of easy removal of the barrier layer. The thickness of the barrier layer may be 1.0 μm or more, 1.5 μm or more, 2 μm or more, 3 μm or more, or 4 μm or more from the viewpoints of ease of forming a barrier layer and resolution. Further, from the viewpoint of suppressing migration of the barrier layer, the thickness of the barrier layer may be 2 μm or more, 3 μm or more, or 4 μm or more.

The ultraviolet absorptance (UV absorptance) of the barrier layer may be from 5 to 95%, from 10 to 90%, or from 15 to 75% from the viewpoint of moderately reducing the sensitivity of a photosensitive layer to be exposed and improving the resolution. The ultraviolet absorptance of the barrier layer can be measured by a ultraviolet-visible spectrophotometer.

<Photosensitive Layer>

The photosensitive layer according to the present embodiment is a layer formed using a photosensitive resin composition described later. The photosensitive resin composition can be used according to desired purposes as long as it is a resin composition whose properties can be changed through irradiation with light (for example, photocured), and may be a negative type or may be a positive type. The photosensitive resin composition may contain (A) a binder polymer, (B) a photopolymerizable compound, and (C) a photopolymerization initiator. Moreover, when necessary, the photosensitive resin composition may contain (D) a photosensitizer, (E) a polymerization inhibitor, or other components. Hereinafter, the components used in the photosensitive resin composition in the present embodiment will be described in more detail.

((A) Binder Polymer)

(A) The binder polymer (hereinafter, also referred to as "component (A)") can be produced through radical polymerization of a polymerizable monomer, for example. Examples of the polymerizable monomer include styrene; polymerizable styrene derivatives such as vinyltoluene and α-methyl styrene substituted at α-position or the aromatic ring; acrylamides such as diacetoneacrylamide; acrylonitriles; ethers of vinyl alcohol such as vinyl-n-butyl ether; alkyl (meth)acrylates; benzyl (meth)acrylate such as benzyl methacrylate; tetrahydrofurfuryl (meth)acrylate; dimethylaminoethyl (meth)acrylate; diethylaminoethyl (meth)acrylate; glycidyl (meth)acrylate; 2,2,2-trifluoroethyl (meth)acrylate; 2,2,3,3-tetrafluoropropyl (meth)acrylate; (meth)acrylic acid; α-bromoacrylic acid; α-chloroacrylic acid; β-furyl(meth)acrylic acid; β-styryl(meth)acrylic acid; maleic acid; maleic anhydride; maleic acid mono esters such as monomethyl maleate, monoethyl maleate, and monoisopropyl maleate; fumaric acid; cinnamic acid; α-cyanocinnamic acid; itaconic acid; crotonic acid; and propiolic acid. These can be used alone or in combinations of two or more.

Among these, alkyl (meth)acrylate esters may be contained in view of improving the plasticity. Examples of the alkyl (meth)acrylate esters include a compound represented by the following formula (II), and compounds in which the alkyl group of the compound is substituted by a hydroxyl group, an epoxy group, or a halogen group.

$$H_2C=C(R^6)-COOR^7 \quad (II)$$

In the formula (II), $R^6$ represents a hydrogen atom or a methyl group, and $R^7$ represents an alkyl group having 1 to 12 carbon atoms. Examples of the alkyl group represented by $R^7$ having 1 to 12 carbon atoms include a methyl group, an ethyl group, a propyl group, a butyl group, a pentyl group, a hexyl group, a heptyl group, an octyl group, a nonyl group, a decyl group, an undecyl group, a dodecyl group, and structural isomers thereof.

Examples of alkyl (meth)acrylate esters represented by the above formula (II) include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, undecyl (meth)acrylate, and dodecyl (meth)acrylate. These can be used alone or in combinations of two or more.

Moreover, the component (A) may contain a carboxyl group in view of alkali developability. The component (A) containing a carboxyl group can be produced through radical polymerization of a polymerizable monomer containing a carboxyl group with another polymerizable monomer, for example. The polymerizable monomer having a carboxyl group may be (meth)acrylic acid or may be methacrylic acid. The acid value of the component (A) containing a carboxyl group may be from 50 to 250 mg-KOH/g, from 50 to 200 mg-KOH/g, or from 100 to 200 mg-KOH/g.

The content of the carboxyl group in the component (A) (proportion of the polymerizable monomer having a carboxyl group in the total amount of the polymerizable monomers used in the binder polymer) may be 12 to 50% by mass, 12 to 40% by mass, 15 to 35% by mass, 15 to 30% by mass, or 20 to 30% by mass in view of improving the alkali developability and the alkali resistance in a good balance. If the content of the carboxyl group is 12% by mass or more, the alkali developability tends to be improved; if the content is 50% by mass or less, the alkali resistance tends to be high.

Since the content of the structural unit originated from a polymerizable monomer having a carboxyl group in the component (A) is correlated with the blending ratio of the polymerizable monomer having a carboxyl group, it may be from 12 to 50 mass %, from 12 to 40 mass %, from 15 to 35 mass %, from 15 to 30 mass %, or from 20 to 30 mass %.

Moreover, in the component (A), styrene or a styrene derivative may be used as the polymerizable monomer in view of the adhesion and the resistance against chemicals. If styrene or a styrene derivative is used as the polymerizable monomer, the content (proportion of styrene or a styrene derivative to the total amount of the polymerizable monomers used in the component (A)) may be 10 to 60% by mass, 15 to 50% by mass, 30 to 50% by mass, 35 to 50% by mass, or 40 to 50% by mass in view of further improving the adhesion and the resistance against chemicals. If the content is 10% by mass or more, the adhesion tends to be improved; if the content is 60% by mass or less, an increase in peeled fragments during developing can be prevented, and an increase in time needed for peeling off tends to be prevented.

Since the content of the structural unit originated from styrene or a styrene derivative in the component (A) is correlated with the blending ratio of the styrene or styrene derivative, it may be from 10 to 60 mass %, from 15 to 50 mass %, from 30 to 50 mass %, from 35 to 50 mass %, or from 40 to 50 mass %.

Moreover, in the component (A), benzyl (meth)acrylate may be used as the polymerizable monomer in view of the resolution and the aspect ratio. The content of the structural unit derived from benzyl (meth)acrylate in the component (A) may be 15 to 50% by mass, 15 to 45% by mass, 15 to 40% by mass, 15 to 35% by mass, or 20 to 30% by mass in view of further improving the resolution and the aspect ratio.

These binder polymers can be used alone or in combinations of two or more. Examples of the components (A) used in combination include two or more binder polymers of different polymerizable monomers, two or more binder polymers having different weight average molecular weights, and two or more binder polymers having different dispersibilities.

The component (A) can be produced by a normal method. Specifically, component (A) can be produced for example, through radical polymerization of alkyl (meth)acrylate, (meth)acrylic acid, and styrene.

The weight average molecular weight of the component (A) may be 20000 to 300000, 40000 to 150000, 40000 to 120000, or 50000 to 80000 in view of improving the mechanical strength and the alkali developability in a good balance. If the weight average molecular weight of the component (A) is 20000 or more, the resistance against the developing solution tends to be high; if the weight average molecular weight is 300000 or less, an increase in developing time tends to be prevented. The weight average molecular weight in this specification indicates the value measured by gel permeation chromatography (GPC) and converted with a calibration curve created using standard polystyrenes.

The content of the component (A) may be 30 to 80 parts by mass, 40 to 75 parts by mass, 50 to 70 parts by mass, or 50 to 60 parts by mass relative to the total amount of 100 parts by mass of the solid contents in the component (A) and the component (B) described later.

If the content of the component (A) is within this range, the coating properties of the photosensitive resin composition and the strength of the photocured portions are further improved.

((B) Photopolymerizable Compound)

The photosensitive resin composition according to the present embodiment may contain (B) a photopolymerizable compound (hereinafter, also referred to as "component (B)"). The component (B) can be used without particular limitation as long as it is a photopolymerizable compound or a photocrosslinkable compound; for example, a compound having at least one ethylenically unsaturated bond in the molecule can be used.

Examples of the component (B) include a compound obtained by reacting an α,β-unsaturated carboxylic acid with a polyhydric alcohol, a bisphenol (meth)acrylate compound, such as a bisphenol A (meth)acrylate compound, a urethane monomer, such as a (meth)acrylate compound having a urethane bond, nonylphenoxy(ethyleneoxy) (meth)acrylate, nonylphenoxyocta(ethyleneoxy) (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, and an alkyl (meth)acrylate. These can be used alone or in combinations of two or more.

Among the above, the component (B) may contain a bisphenol type (meth)acrylate compound in view of improving the resolution, the adhesion, and prevention properties of generation of resist skirts in a good balance. The bisphenol type (meth)acrylate compound may be a compound represented by the following formula (III):

[Chemical Formula 8]

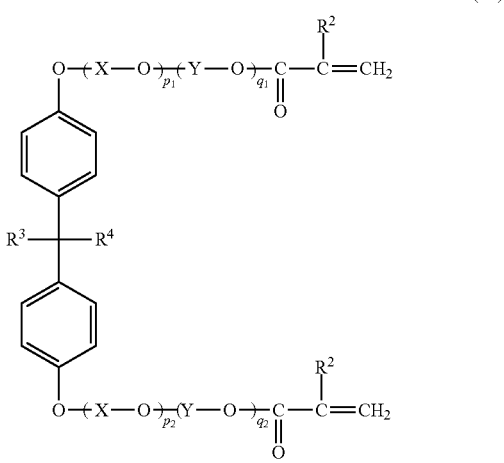

(III)

In formula (III), $R^1$, $R^2$, $R^3$, and $R^4$ each independently represent a hydrogen atom or a methyl group; X and Y each independently represent an ethylene group or a propylene group; XO and YO each independently represent an oxyethylene group (hereinafter, also referred to as "EO group" in some cases) or an oxypropylene group (hereinafter, also referred to as "PO group" in some cases); $p_1$, $p_2$, $q_1$, and $q_2$ each independently represent a numeric value of 0 to 40, where $p_1+q_1$ and $p_2+q_2$ each are 1 or more; if X is an ethylene group and Y is a propylene group, $p_1+p_2$ is 1 to 40 and $q_1+q_2$ is 0 to 20; if X is a propylene group and Y is an ethylene group, $p_1+p_2$ is 0 to 20 and $q_1+q_2$ is 1 to 40; because $p_1$, $p_2$, $q_1$, and $q_2$ represent the number of structural units of an EO group or a PO group, $p_1$, $p_2$, $q_1$, and $q_2$ represent an integer value in a single molecule, and represent a rational number, which is the average, in the collection of molecules of several species. The EO group and the PO group each may be present in block in a continuous manner, or may be present at random.

In formula (III), when X and Y are both an ethylene group, $p_1+p_2+q_1+q_2$ may be 1 to 20, 1 to 10, or 1 to 7 from the viewpoint of superior resolution and adhesion.

Examples of a compound represented by formula (III) include 2,2-bis(4-((meth)acryloxypolyethoxy)phenyl)propane, 2,2-bis(4-((meth)acryloxypolypropoxy)phenyl)propane, and 2,2-bis(4-((meth)acryloxypolyethoxypolypropoxy)phenyl)propane. The above may be used singly or in combinations of two or more.

Examples of a commercially available bisphenol (meth)acrylate compound include 2,2-bis(4-(methacryloxydiethoxy)phenyl)propane ("BPE-200", manufactured by Shin-Nakamura Chemical Co., Ltd.), 2,2-bis(4-(methacryloxypentaethoxy)phenyl)propane ("BPE-500", manufactured by Shin-Nakamura Chemical Co., Ltd., or "FA-321 M", manufactured by Hitachi Chemical Co., Ltd.), 2,2-bis(4-(methacryloxypentadecaethoxy)phenyl)propane ("BPE-1300", manufactured by Shin-Nakamura Chemical Co., Ltd.), and 2,2-bis(4-(methacryloxypolyethoxy)phenyl) propane ("BP-2EM", manufactured by Kyoeisha Chemical Co., Ltd. (EO groups: 2.6 (average value))).

The content of a bisphenol (meth)acrylate compound may be from 1 to 50 mass %, from 3 to 40 mass %, from 10 to 40 mass %, from 20 to 40 mass %, or from 30 to 40 mass % with respect to the total amount of solid contents in the component (A) and the component (B) from the viewpoint of further improvement of chemical resistance.

Moreover, the content of the bisphenol type (meth)acrylate compound may be 30 to 99% by mass, 50 to 97% by mass, 60 to 95% by mass, 70 to 95% by mass, or 80 to 90% by mass relative to the total amount of solid contents in the component (B) in view of further improving the resistance against chemicals.

Moreover, the content of the compound represented by the formula (III) having 1 to 7 EO and PO groups in total may be 1 to 50% by mass, 2 to 48% by mass, 3 to 45% by mass, 5 to 40% by mass, 10 to 30% by mass, or 10 to 25% by mass relative to the total amount of solid contents in the component (A) and the component (B) in view of further improving the resolution.

Moreover, a compound obtained through a reaction of polyhydric alcohol with α,β-unsaturated carboxylic acid may be contained in view of further improving the followability of the substrate to depressions and projections. As such a compound, polyalkylene glycol di(meth)acrylate having both of an EO group and a PO group in the molecule, or dipentaerythritol (meth)acrylate having an EO group can be used. Examples of commercially available compounds as dipentaerythritol (meth)acrylate having an EO group include "DPEA-12" manufactured by NIPPON KAYAKU Co., Ltd. Examples of a commercially available dipentaerythritol (meth)acrylate having an EO group include "DPEA-12" manufactured by Nippon Kayaku Co., Ltd. The content of dipentaerythritol (meth)acrylate having an EO group may be from 1 to 10 mass %, from 1.5 to 8 mass %, from 2 to 8 mass %, from 2.5 to 8 mass %, or from 3 to 8 mass % with respect to the total amount of solid contents in the component (B) from the viewpoint of improvement of resolution.

In the molecule of polyalkylene glycol di(meth)acrylate having both of an EO group and a PO group, the EO group and the PO group each may be present in blocks in a continuous manner, or may be present at random. Moreover, the PO group may be either an oxy-n-propylene group or an oxyisopropylene group. In the (poly)oxyisopropylene group, the secondary carbon of the propylene group may bond to an oxygen atom, or the primary carbon may bond to an oxygen atom.

Examples of a commercially available poly(alkylene glycol) di(meth)acrylates having both an EO group and a PO group include a poly(alkylene glycol) di(meth)acrylate having 6 (average value) EO groups, and 12 (average value) PO groups ("FA-023M" and "FA-024M", manufactured by Hitachi Chemical Co., Ltd.). The content of a poly(alkylene glycol) di(meth)acrylate having both an EO group and a PO group may be from 1 to 15 mass %, from 1.5 to 15 mass %, from 2 to 13 mass %, or from 3 to 13 mass % with respect to the total amount of solid contents in the component (B) from the viewpoint of improvement of followability of the substrate to depressions and projections, and resolution.

The content of the component (B) may be 20 to 70 parts by mass, 25 to 60 parts by mass, or 30 to 50 parts by mass relative to the total amount of 100 parts by mass of solid contents in the component (A) and the component (B). If the content of the component (B) is within this range, the resolution of the photosensitive resin composition, the adhesion, prevention properties of generation of resist skirts, the photosensitivity, and coating properties are further improved.

((C) Photopolymerization Initiator)

The photosensitive resin composition according to the present embodiment may contain at least one (C) photopolymerization initiator (hereinafter, also referred to as "component (C)"). The component (C) is not particularly limited as long as it is a component which can polymerize the component (B), and can be appropriately selected from photopolymerization initiators usually used.

Examples of the component (C) include aromatic ketones such as 2-benzyl-2-dimethylamino-1-(4-morpholinophenyl)-butanone-1,2-methyl-1-[4-(methylthio)phenyl]-2-morpholino-propanone-1; quinones such as alkylanthraquinone; benzoin ether compounds such as benzoin alkylether; benzoin compounds such as benzoin and alkyl benzoin; benzyl derivatives such as benzyl dimethyl ketal; 2,4,5-triarylimidazole dimers such as 2-(o-chlorophenyl)-4,5-diphenylimidazole dimers, 2-(o-fluorophenyl)-4,5-diphenylimidazole dimers; and acridine derivatives such as 9-phenylacridine, 1,7-(9,9'-acridinyl)heptane. These can be used alone or in combinations of two or more.

Among these, 2,4,5-triarylimidazole dimers may be contained in view of improving the resolution. Examples of the 2,4,5-triarylimidazole dimers include 2-(o-chlorophenyl)-4, 5-diphenylimidazole dimers, 2-(o-chlorophenyl)-4,5-bis-(m-methoxyphenyl)imidazole dimers, and 2-(p-methoxyphenyl)-4,5-diphenylimidazole dimers. Among these, 2-(o-chlorophenyl)-4,5-diphenylimidazole dimers may be contained in view of improving the photosensitive stability.

As the 2,4,5-triarylimidazole dimers, for example, 2,2'-bis(2-chlorophenyl)-4,4',5,5'-tetraphenylbiimidazole is commercially available as B-CIM (product name, manufactured by HODOGAYA CHEMICAL CO., LTD.).

The component (C) may contain at least one 2,4,5-triarylimidazole dimer and 2-(2-chlorophenyl)-4,5-diphenylimidazole dimers from the viewpoint of further improving the photosensitivity and the adhesion, and further preventing the light absorption of the component (C). In the 2,4,5-triarylimidazole dimers, the structure may be symmetrical or may be asymmetrical.

The content of the component (C) may be 0.01 to 30 parts by mass, 0.1 to 10 parts by mass, 1 to 7 parts by mass, 1 to 6 parts by mass, 1 to 5 parts by mass, or 2 to 5 parts by mass relative to the total amount of 100 parts by mass of solid contents in the component (A) and the component (B). If the content of the component (C) is 0.01 parts by mass or more, the photosensitivity, the resolution, and the adhesion tend to be improved; if the content is 30 parts by mass or less, the shape of the resist pattern tends to be excellent.

((D) Photosensitizer)

The photosensitive resin composition according to the present embodiment may contain (D) a photosensitizer (hereinafter, also referred to as "component (D)"). If the component (D) is contained, the absorption wavelength of the active light beams used in exposure tends to be able to be effectively used.

Examples of the component (D) include pyrazolines, dialkylaminobenzophenones, anthracenes, coumarins, xanthones, oxazoles, benzooxazoles, thiazoles, benzothiazoles, triazoles, stilbenes, triazines, thiophenes, naphthalimides, and triarylamines. These may be used alone or in combinations of two or more. In view of more effectively using the absorption wavelength of the active light beams used in exposure, the component (D) may contain pyrazolines, anthracenes, or dialkylaminobenzophenone; among these, dialkylaminobenzophenones may be contained. Examples of commercially available compounds as dialkylaminobenzophenones include "EAB" manufactured by HODOGAYA CHEMICAL CO., LTD.

If the component (D) is contained, the content may be 1.0 part by mass or less, 0.5 parts by mass or less, 0.15 parts by mass or less, 0.12 parts by mass or less, or 0.10 parts by mass or less relative to the total amount of 100 parts by mass of solid contents in the component (A) and the component (B). If the content of the component (D) is 1.0 part by mass or less relative to the total amount of 100 parts by mass of solid contents in the component (A) and the component (B), a poor shape of the resist pattern and generation of resist skirts can be prevented, and the resolution tends to be further improved. The content of the component (D) may be 0.01 parts by mass or more with respect to 100 parts by mass of the total amount of solid contents in the component (A) and the component (B) from the viewpoint of easy availability of high photosensitivity and superior resolution.

((E) Polymerization Inhibitor)

The photosensitive resin composition according to the present embodiment may contain (E) a polymerization inhibitor (hereinafter, also referred to as "component (E)"). If the component (E) is contained, the exposure amount needed to photo-cure the photosensitive resin composition can be adjusted to the optimal exposure amount for exposure with a projecting exposing apparatus.

In view of further improving the resolution, the component (E) may contain a compound represented by the following formula (I):

[Chemical Formula 9]

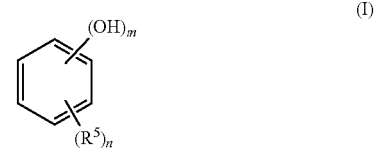

In formula (I), $R^5$ represents a halogen atom, a hydrogen atom, an alkyl group having 1 to 20 carbon atoms, a cycloalkyl group having 3 to 10 carbon atoms, an amino group, an aryl group, a mercapto group, an alkylmercapto group having 1 to 10 carbon atoms, a carboxylalkyl group having an alkyl group having 1 to 10 carbon atoms, an alkoxy group having 1 to 20 carbon atoms, or a heterocyclic group; for m and n, m is an integer of 2 or more, n is an integer of 0 or more where the integers are selected such that m+n=6; if n is an integer of 2 or more, $R^5$ each may be the same or different. The aryl group may be substituted by an alkyl group having 1 to 20 carbon atoms.

$R^5$ may be a hydrogen atom or an alkyl group having 1 to 20 carbon atoms in view of further improving the miscibility with the component (A). The alkyl group having 1 to 20 carbon atoms represented by $R^5$ may be an alkyl group having 1 to 4 carbon atoms. In view of further improving the resolution, n may be 2 or 3, or may be 2.

Examples of a compound represented by the above formula (I) include an alkylcatechol, such as catechol, resorcinol (resorcinol), 1,4-hydroquinone, 2-methylcatechol, 3-methylcatechol, 4-methylcatechol, 2-ethylcatechol, 3-ethylcatechol, 4-ethylcatechol, 2-propylcatechol, 3-propylcatechol, 4-propylcatechol, 2-n-butylcatechol, 3-n-butylcatechol, 4-n-butylcatechol, 2-tert-butylcatechol, 3-tert-butylcatechol, 4-tert-butylcatechol, and 3,5-di-tert-butylcatechol; an alkylresorcinol, such as 2-methylresorcinol, 4-methylresorcinol, 5-methylresorcinol (orcine), 2-ethylresorcinol, 4-ethylresorcinol, 2-propylresorcinol, 4-propylresorcinol, 2-n-butylresorcinol, 4-n-butylresorcinol, 2-tert-butylresorcinol, and 4-tert-butylresorcinol; an alkylhydroquinone, such as methylhydroquinone, ethylhydroquinone, propylhydroquinone, tert-butylhydroquinone, and 2,5-di-tert-butylhydroquinone; pyrogallol; and phloroglucin. The above may be used singly or in combination of two or more kinds thereof.

Among the compounds represented by the above formula (I) may be alkylcatechol in view of further improving the resolution.

The content of the component (E) may be 0.001 to 0.3 parts by mass, 0.005 to 0.2 parts by mass, 0.01 to 0.15 parts by mass, or 0.015 to 0.1 parts by mass relative to the total amount of 100 parts by mass of solid contents in the component (A) and the component (B). If the content of the component (E) is 0.3 parts by mass or less, the exposing time can be shortened, contributing to an improvement in efficiency of mass production. Moreover, if the content of the component (E) is 0.001 parts by mass or more, the photoreaction of photocured portions can sufficiently progress; by an improvement in reaction rate, resist swelling properties can be prevented, and the resolution can be further improved. Since with the photosensitive element of this embodiment, the resolution can be improved by moderately reducing the sensitivity even without increasing the amount of the polymerization inhibitor, even when the content of the component (E) is reduced to 0.1 parts by mass or less, superior resolution can be obtained. Further, when the content of the component (E) is reduced to 0.1 parts by mass or less, the photosensitive layer can stably exhibit a moderate sensitivity.

Moreover, the content of the component (E) may be 0.001 to 0.3 parts by mass, 0.005 to 0.2 parts by mass, 0.01 to 0.15 parts by mass, or 0.015 to 0.1 parts by mass relative to 100 parts by mass of the solid content in the component (A). If the content of the component (E) is 0.001 parts by mass or more relative to the component (A), the thermal stability of the photosensitive resin composition can be improved; if the content is 0.3 parts by mass or less, yellowing of the photosensitive resin composition can be prevented.

(Other Components)

A photosensitive resin composition according to the present embodiment may contain, if necessary, additives including a dye, such as malachite green, victoria pure blue, brilliant green, and methyl violet, a photo-coloring agent, such as tribromophenylsulfone, leuco crystal violet, diphenylamine, benzylamine, triphenylamine, diethylaniline, o-chloroaniline, and tert-butylcatechol, a thermal coloring inhibitor, a plasticizer, such as p-toluenesulfonamide, a pigment, a filler, an antifoaming agent, a flame retardant, a tackifier, a leveling agent, a release accelerator, an antioxidant, a fragrance, an imaging agent, and a thermal cross-linking agent each at 0.01 to 20 parts by mass with respect to 100 parts by mass of the total amount of solid contents in the component (A) and the component (B). These additives can be used alone or in combinations of two or more.

Moreover, the photosensitive resin composition according to the present embodiment can contain at least one organic solvent when necessary to improve the handling properties of the photosensitive composition or adjust the viscosity and the storage stability. As the organic solvent, an organic solvent usually used can be used without particular limitation. Specific examples thereof include an organic solvent, such as methanol, ethanol, acetone, methyl ethyl ketone, methyl cellosolve, ethyl cellosolve, toluene, N, N-dimethylformamide, and propylene glycol monomethyl ether, or a mixed solvent thereof. These can be used alone or in combinations of two or more.

<Protective Layer>

In the photosensitive element according to the present embodiment, a protective layer can be laminated on the surface of the photosensitive layer opposite to the surface thereof contacting the barrier layer. As the protective layer, a polymer film of polyethylene, polypropylene, or the like can be used, for example. Moreover, a polymer film similar to the support film described above may be used, or a polymer film different from that may be used.

Hereinafter, a method of producing a photosensitive element in which the support film, the barrier layer, the photosensitive layer, and the protective layer are sequentially laminated will be described.

<Method of Producing Photosensitive Element>

First, for example, a water-soluble resin containing polyvinyl alcohol is gradually added to a mixed solvent of water heated to between 70 and 90° C. and an organic solvents used as necessary, such that the content of the solid component becomes between 10 and 20% by mass, and the mixture is stirred for about an hour. Thereafter, an ultraviolet absorber is added and dissolved uniformly to prepare a resin composition for forming a barrier layer containing polyvinyl alcohol and the ultraviolet absorber. In this specification, the "solid content" indicates non-volatile contents in the resin composition excluding volatile substances such as water, organic solvents, and the like. Namely, the "solid content" indicates components other than a solvent such as water and an organic solvent, remaining without volatilizing after the drying step, and includes components in the form of liquid, starch syrup, and wax at room temperature of about 25° C.

Next, the resin composition for forming a barrier layer is applied onto a support film, and is dried to form a barrier layer. Application of the resin composition for forming a barrier layer onto the support film can be performed by a known method such as roll coating, comma coating, gravure coating, air knife coating, die coating, bar coating, or spray coating.

Moreover, drying of the applied resin composition for forming a barrier layer is not particularly limited as long as at least part of the solvent such as water can be removed; the resin composition for forming a barrier layer may be dried at 70 to 150° C. for 5 to 30 minutes. After drying, the amount of residual solvent in the barrier layer may be 2% by mass or less in view of preventing diffusion of the solvent in the subsequent step.

Next, similarly to the application of the resin composition for forming a barrier layer, a photosensitive resin composition may be applied onto the barrier layer of the support film having the barrier layer formed thereon, and may be dried to form a photosensitive layer on the barrier layer. Next, by laminating a protective layer on the photosensitive layer thus formed, a photosensitive element including the support film, the barrier layer, the photosensitive layer, and the protective layer in this order can be produced. Moreover, by bonding a support film having a barrier layer formed thereon and a protective layer having a photosensitive layer formed thereon, a photosensitive element including a support film, a barrier layer, a photosensitive layer, and a protective layer in this order may be obtained.

The thickness of the photosensitive layer in a photosensitive element may be selected appropriately depending on the application, and it may be 1 µm or more, 5 µm or more, or 10 µm or more, and may be 200 µm or less, 100 µm or less, 50 µm or less, or less than 20 µm in terms of the thickness after drying. When the thickness of the photosensitive layer is 1 µm or more, 5 µm or more, or 10 µm or more, coating on an industrial scale is facilitated and the productivity tends to be improved. Further, when the thickness of the photosensitive layer is 200 µm or less, 100 µm or less, 50 µm or less, or less than 20 µm, the photosensitivity is high, and the photocuring property at the resist bottom is excellent so that a resist pattern superior in resolution and aspect ratio tends to be formed.

The melt viscosity at 110° C. of the photosensitive layer in the photosensitive element can be appropriately selected according to the type of the substrate contacting the photosensitive layer; the melt viscosity at 110° C. after drying may be 50 to 10000 Pa-s, 100 to 5000 Pa-s, or 200 to 1000 Pa-s. If the melt viscosity at 110° C. is 50 Pa-s or more, wrinkles and voids are not generated in the lamination step, and the productivity tends to be improved. Moreover, if the melt viscosity at 110° C. is 10000 Pa-s or less, the adhesiveness to the undercoat is improved in the lamination step, and bonding deficits tend to be reduced.

There is no particular restriction on the shape of a photosensitive element according to the present embodiment. It may be, for example, in a sheet form, or in a roll form wound up on a core. When it is wound up in a roll form, it may be wound up such that a support film comes to the outer side. As a winding core, for example, a plastic, such as a polyethylene resin, a polypropylene resin, a polystyrene resin, a poly(vinyl chloride) resin, and an ABS resin (an acrylonitrile-butadiene-styrene copolymer) may be used.

On the end face of a roll-formed photosensitive element roll obtained as above, from the viewpoint of protection of the end face, an end face separator may be provided, and from the viewpoint of resistance to edge fusion, a moisture-proof end face separator may be provided. As for a packaging method, the roll may be wrapped in a black sheet with low moisture permeability.

The photosensitive element according to the present embodiment can be suitably used in the method for forming a resist pattern and the method for producing a printed wiring board described later.

[Method for Forming Resist Pattern]

A method for forming a resist pattern according to the present Embodiment comprises (i) a step of disposing a photosensitive layer, a barrier layer, and a support film on a substrate in this order from the substrate side using the photosensitive element (hereinafter also referred to as a "(i) step of forming a photosensitive layer and a barrier layer"); (ii) a step of removing the support film and exposing the photosensitive layer to active light beams through the barrier layer (hereinafter also referred to as a "(ii) step of exposure"); and (iii) a step of removing the barrier layer and uncured portions of the photosensitive layer from the substrate (hereinafter also referred to as a "(iii) step of development"); and may comprise another step as needed. The resist pattern is also referred to as a photocured product pattern of the photosensitive resin composition, or is also referred to as a relief pattern. Moreover, according to the purpose, the resist pattern in the present embodiment may be used as a resist, or may be used in other applications such as protective films.

((i) Step Forming Photosensitive Layer and Barrier Layer)

In the step of forming a photosensitive layer and a barrier layer, a photosensitive layer and a barrier layer are formed on a substrate using the photosensitive element. The substrate is not particularly limited; usually, a substrate for forming a circuit including an insulating layer and a conductive layer formed on the insulating layer, or a die pad such as an alloy substrate (substrate for a lead frame) is used.

As the method of forming a photosensitive layer and a barrier layer on a substrate, for example, if a photosensitive element having a protective layer is used, the protective layer is removed, and the photosensitive layer in the photosensitive element is press bonded to the substrate while being heated; thereby, a photosensitive layer and a barrier layer can be formed on the substrate. Thereby, a laminated body including a substrate, a photosensitive layer, a barrier layer, and a support film in this order is obtained.

If the step of forming a photosensitive layer and a barrier layer is performed using the photosensitive element, the step may be performed under reduced pressure in view of the adhesion and the followability. The heating during press bonding may be performed at a temperature of 70 to 130° C., and the press bonding may be performed at a pressure of 0.1 to 1.0 MPa (1 to 10 kgf/cm$^2$); these conditions may be appropriately selected when necessary. If the photosensitive layer in the photosensitive element is heated to 70 to 130° C., a pre-heating treatment of the substrate is not necessary; the pre-heating treatment of the substrate can be performed to further enhance the adhesion and the followability.

((ii) Exposing Step)

In the exposing step, the support film is removed, and the photosensitive layer is exposed to active light beams through the barrier layer. Thereby, the exposed portions irradiated with the active light beams may be photocured to form photocured portions (latent image), or unexposed portions not irradiated with the active light beams may be photocured to form photocured portions. If a photosensitive layer and a barrier layer are formed using the photosensitive element, the support film present on the photosensitive layer is peeled off, and then exposure is performed. By exposing a photosensitive layer through a barrier layer, a resist pattern superior in resolution and resist pattern shape may be formed.

As the exposure method, a known exposure method can be used; examples thereof include a method (mask exposure method) of irradiating an object with active light beams through a negative or positive mask pattern called art work into the form of an image, a LDI (Laser Direct Imaging) exposure method, or a method (projection exposure method) of irradiating an object with active light beams to which the image of a photomask is projected through a lens in the form of an image. Among them, a projection exposure method may be used from the viewpoint of superior resolution. In other words, the photosensitive element according to the present embodiment is used in the projection exposure method. The projection exposure method is also referred to as an exposure method using active light beams having a decayed energy amount.

The light source for the active light beams is not particularly limited as long as it is a known light source usually used; for example, a gas laser such as a carbon arc lamp, a mercury steam arc lamp, an ultrahigh pressure mercury lamp, a high pressure mercury lamp, a xenon lamp, or an argon laser; or a light source effectively emitting ultraviolet light such as a solid laser such as a YAG laser, or a semiconductor laser such as a gallium nitride-based blue violet laser is used. Moreover, a photoflood lamp for a photograph, or a light source effectively emitting visible light such as a sun lamp may be used. Among these, in view of improving the resolution and the alignment properties in a good balance, a light source which can emit i-ray monochromatic light having an exposure wavelength of 365 nm, a light source which can emit h-ray monochromatic light having an exposure wavelength of 405 nm, or a light source which can emit active light beams having a exposure wavelength of mixed i-ray, h-ray, and g-ray may be used; among these, the light source which can emit i-ray monochromatic light having an exposure wavelength of 365 nm may be used. Examples of the light source which can emit i-ray monochromatic light having an exposure wavelength of 365 nm include ultrahigh pressure mercury lamps.

((iii) Developing Step)

In the developing step, the barrier layer and the uncured portions of the photosensitive layer are removed from the substrate. By the developing step, a resist pattern composed of the photocured portions of the photosensitive layer is formed on the substrate. If the barrier layer is water-soluble, the barrier layer may be washed with water and removed, and the uncured portions other than the photocured portions may be removed with a developing solution, or if the barrier layer has solubility to the developing solution, the barrier layer with the uncured portions other than the photocured portions may be removed with the developing solution. Examples of the developing method include wet development.

In the case of wet development, developing can be performed using a developing solution corresponding to the photosensitive resin composition by a known wet development method. Examples of the wet development method include methods using dipping, paddling, high pressure spraying, brushing, slapping, scrapping, and swing immersion; from the viewpoint of improving the resolution, high pressure spraying is most suitable. These wet development methods may be used alone or in combinations of two or more to perform developing.

The developing solution is appropriately selected according to the configuration of the photosensitive resin composition. Examples thereof include alkaline aqueous solutions, and organic solvent developing solutions.

In view of safety, stability, and good operationability, an alkaline aqueous solution may be used as the developing solution. As the base for the alkaline aqueous solution, for example, alkali hydroxides such as hydroxides of lithium, sodium, and potassium; alkali carbonates such as carbonates or bicarbonates of lithium, sodium, potassium, and ammonium; alkali metal phosphates such as potassium phosphate, and sodium phosphate; alkali metal pyrophosphates such as sodium pyrophosphate and potassium pyrophosphate; sodium borate, sodium metasilicate, tetramethylammonium hydroxide, ethanolamine, ethylenediamine, diethylenetriamine, 2-amino-2-hydroxymethyl-1,3-propan diol, 1,3-diamino-2-propanol, and morpholine are used.

As an alkaline aqueous solution used in developing, for example, a diluted solution of 0.1 to 5% by mass sodium carbonate, a diluted solution of 0.1 to 5% by mass potassium carbonate, a diluted solution of 0.1 to 5% by mass sodium hydroxide, a diluted solution of 0.1 to 5% by mass sodium tetraborate, or the like can be used. Moreover, the pH of the alkaline aqueous solution used in developing may be in the range of 9 to 11, and the temperature of the alkaline aqueous solution can be adjusted according to the developability of the photosensitive layer. Moreover, a surfactant or an antifoaming agent and a small amount of organic solvent for promoting development and the like may be mixed with the alkaline aqueous solution. Examples of the organic solvent used in the alkaline aqueous solution include 3-acetone alcohol, acetone, ethyl acetate, alkoxyethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether.

Examples of the organic solvent used in the organic solvent developing solution include 1,1,1-trichloroethane, N-methylpyrrolidone, N,N-dimethylformamide, cyclohexanone, methyl isobutyl ketone, and γ-butyrolactone. These organic solvents may be used as an organic solvent developing solution by adding water to control such that the organic solvent is in the range of 1 to 20% by mass from the viewpoint of preventing burning.

(Other Steps)

The method for forming a resist pattern according to the present embodiment may comprise a step of further curing a resist pattern by heating at 60 to 250° C. or performing exposure at an exposure amount of 0.2 to 10 $J/cm^2$ when necessary after the uncured portions are removed in the developing step.

[Method for Producing Printed Wiring Board]

The method for producing a printed wiring board according to the present embodiment comprises a step of etching or plating the substrate having a resist pattern formed thereon by the method for forming a resist pattern to form a conductive pattern, and may comprise other steps such as a step of removing the resist pattern when necessary. The method for producing a printed wiring board according to the present embodiment can be suitably used in formation of a conductive pattern by using the method for forming a resist pattern using the photosensitive element; especially, the method for producing a printed wiring board according to the present embodiment is more suitable for application to the method of forming a conductive pattern by plating. The conductive pattern is also referred to as circuit.

In etching, using the resist pattern formed on the substrate including the conductive layer as a mask, the conductive layer on the substrate not coated with the resist is removed by etching to form a conductive pattern.

The etching method is appropriately selected according to the conductive layer to be removed. Examples of an etching solution include a cupric chloride solution, a ferric chloride solution, an alkali etching solution, and a hydrogen peroxide-based etching solution; a ferric chloride solution may be used because the etching factor is good.

In contrast, in plating, using the resist pattern formed on the substrate including the conductive layer as a mask, the conductive layer on the substrate not coated with the resist is plated with copper or solder. After plating, the resist is removed by removal of the resist pattern described later, and the conductive layer coated with the resist is further etched to form a conductive pattern.

The plating method may be electrolytic plating or may be non-electrolytic plating; among these, non-electrolytic plating may be used. Examples of non-electrolytic plating include copper plating such as copper sulfate plating, copper pyrophosphate plating; solder plating such as high throw solder plating; nickel plating such as Watts bath (nickel sulfate-nickel chloride) plating, nickel sulfamate plating; and gold plating such as hard gold plating, soft gold plating.

After the etching or plating, the resist pattern on the substrate is removed. In the removal of the resist pattern, for example, the resist pattern can be peeled off more significantly by a strongly alkaline aqueous solution than by the alkaline aqueous solution used in the developing step. As the strongly alkaline aqueous solution, for example, a 1 to 10% by mass sodium hydroxide aqueous solution, a 1 to 10% by mass potassium hydroxide aqueous solution, or the like is used. Among these, a 1 to 5% by mass sodium hydroxide aqueous solution or a potassium hydroxide aqueous solution may be used.

Examples of the method of removing the resist pattern include immersion and spraying; these may be used alone or in combinations.

If the resist pattern is removed after plating is performed, the conductive layer coated with the resist can be further etched by etching to form a conductive pattern; thereby, a desired printed wiring board can be produced. The etching method at this time is appropriately selected according to the conductive layer to be removed. For example, the etching solution described above can be used.

The method for producing a printed wiring board according to the present embodiment can be used not only in production of the single layer printed wiring board but also in production of the multi-layer printed wiring board, and can be also used in production of printed wiring boards having through holes having small diameters.

The method for producing a printed wiring board according to the present embodiment can be suitably used in production of high density package substrates and particularly in production of wiring plates by a semi additive process. One example of the step of producing a wiring plate by the semi additive process is illustrated in FIG. 2.

Figure 2:
FIG. 2 is a diagram schematically illustrating one example of a step of producing a printed wiring board by a semi additive process.
Figure 2:
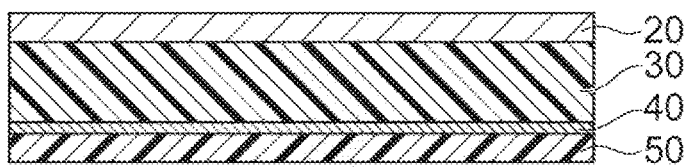
Figure 2:
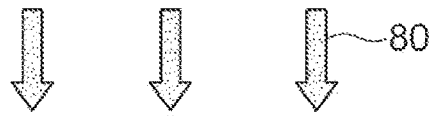
Figure 2:
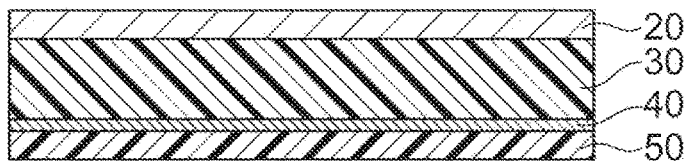
Figure 2:
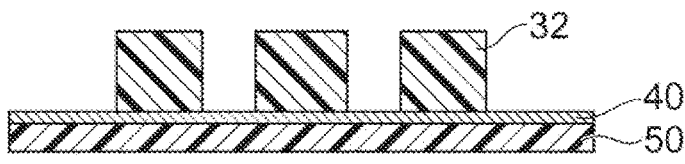
Figure 2:
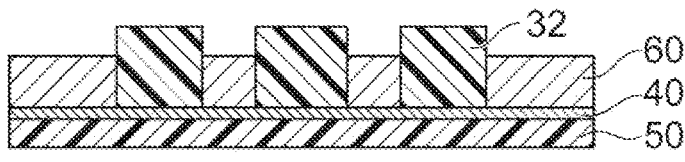
Figure 2:
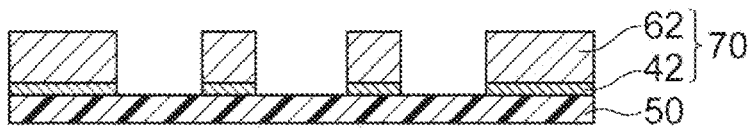

In FIG. 2(a), a substrate (substrate for forming a circuit) having a conductive layer 40 formed on an insulating layer 50 is prepared. A conductive layer 40 is a copper layer, for example. In FIG. 2(b), a photosensitive layer 30 and a barrier layer 20 are formed on the conductive layer 40 on the substrate by the step of forming a photosensitive layer and a barrier layer. In FIG. 2(c), by the exposing step, the photosensitive layer 30 is irradiated with active light beams 80 which project an image of a photomask through the barrier layer 20 to form photocured portions on the photosensitive layer 30. In FIG. 2(d), by the developing step, the regions (including the barrier layer) other than the photocured portions formed by the exposing step are removed from the substrate to form a resist pattern 32 as the photocured portions on the substrate. In FIG. 2(e), by plating using the resist pattern 32 as the photocured portions as a mask, a plated layer 60 is formed on the conductive layer 40 on the substrate not coated with the resist. In FIG. 2(f), the resist pattern 32 as the photocured portions is peeled off with the strongly alkaline aqueous solution, and the conductive layer 40 masked with the resist pattern 32 is removed by flash etching to form a conductive pattern 70 including a plated layer 62 after etching and a conductive layer 42 after etching. The material for the conductive layer 40 and that for the plated layer 60 may be the same or different. If the materials for the conductive layer 40 and for the plated layer 60 are the same, the conductive layer 40 and the plated layer 60 may be integrated. Although the projection exposure method has been described in FIG. 2, the resist pattern 32 may be formed in combination with a mask exposure method or an LDI exposure method.

Although the suitable embodiments of the present disclosure have been described, the present disclosure will not be limited to the embodiments.

EXAMPLES

Hereinafter, the present invention is more concretely explained on the basis of Examples, but this disclosure is not limited to following Examples. In addition, unless otherwise stated, "parts" and "%" are based on mass.

First, the binder polymer (A-1) was synthesized according to Synthetic Example 1.

Synthetic Example 1

As polymerization monomers, 125 g of methacrylic acid, 25 g of methyl methacrylate, 125 g of benzylmethacrylate, and 225 g of styrene were mixed with 1.5 g of azobisisobutyronitrile to prepare a solution "a".

Moreover, 1.2 g of azobisisobutyronitrile was dissolved in 100 g of mixed solution of 60 g of methyl cellosolve and 40 g of toluene (mass ratio 3:2) to prepare a solution "b".

On the other hand, 400 g of mixed solution (hereinafter, also referred to as "mixed solution x") of methyl cellosolve and toluene with a mass ratio of 3:2 was put into a flask equipped with a stirrer, a reflux condenser, a thermometer, a dripping funnel and a nitrogen gas introducing tube, and the solution was stirred while blowing a nitrogen gas and heated to 80° C.

The solution "a" was dropped to the mixed solution x in the flask for 4 hours at a constant dropping rate and then stirred at 80° C. for 2 hours. Subsequently, after the solution "b" was dropped to the solution in this flask for 10 minutes at a constant dropping rate, the resulting solution in the flask was stirred at 80° C. for 3 hours. Moreover, the solution in the flask was heated to 90° C. for 30 minutes, and the temperature was kept at 90° C. for 2 hours and then cooled to room temperature to obtain a solution of the binder polymer (A-1). This solution of the binder polymer (A-1) was prepared by adding the mixed solution x so that non-volatile components (solid content) might be 50 mass %.

The weight average molecular weight of the binder polymer (A-1) was 50000, and the acid value was 163 mgKOH/g. The acid value was measured with a neutralization titration method. Specifically, after 30 g of acetone was added to 1 g of solution of the binder polymer and further dissolved uniformly, a proper amount of phenolphthalein as an indicator was added to the solution of the binder polymer, and measurement was performed with titration using 0.1 N of KOH aqueous solution. The weight average molecular weight was measured with gel permeation chromatography methods (GPC) and then derived by conversion using the calibration curve of standard polystyrene. The conditions of GPC are shown below.

—GPC Conditions—

Pump: Hitachi L-6000 type (manufactured by Hitachi, Ltd.) Column: the following three columns (column specification: 10.7 mmφ×300 mm, all manufactured by Hitachi Chemical Company, Ltd.)

Gelpack GL-R420
Gelpack GL-R430
Gelpack GL-R440

Eluant: tetrahydrofuran
Sample concentration: 120 mg of binder polymer in which solid content was 50 mass % was collected and dissolved in 5 mL of tetrahydrofuran to prepare samples.
Measurement temperature: 25° C.
Flow rate: 2.05 mL/min.
Detector: Hitachi L-3300 type RI (product name, manufactured by Hitachi, Ltd.)

<Preparation of Resin Composition for Barrier Layer Formation>

Next, the respective components shown in the following Table 1 were mixed in amounts shown in the same tables (unit: part by mass) to obtain resin compositions for barrier layer formation. Specifically, a water-soluble resin was added gradually to water and alcohols at room temperature, and when addition of the whole amount was completed the mixture was heated to 90° C. After reaching 90° C., the mixture was stirred for 1 hour and cooled to room temperature to obtain a resin composition for forming a barrier layer. Each of the blending amounts other than the solvents in Table 1 is a blending amount as a solid content.

<Preparation of Photosensitive Resin Composition>

Next, the respective components shown in the following Table 1 were mixed in amounts shown in the same table (unit: part by mass) to obtain photosensitive resin compositions.

TABLE 1

| Item | | Ex. 1 | Ex. 2 | Ex. 3 | Ex. 4 | Ex. 5 | Ex. 6 | Ex. 7 | Comp. Ex. 1 |
|---|---|---|---|---|---|---|---|---|---|
| Support film | | FB-40 | FB-40 | FB-40 | FB-40 | FB-40 | FB-40 | FB-40 | FB-40 |
| Resin composition for forming barrier layer | PVA-205*1 | 60 | 60 | 60 | 60 | 60 | 60 | 60 | 60 |
| | PVP K-30*2 | 40 | 40 | 40 | 40 | 40 | 40 | 40 | 40 |
| | Water | 500 | 500 | 500 | 500 | 500 | 500 | 500 | 500 |
| | 1-Propanol | 250 | 250 | 250 | 250 | 250 | 250 | 250 | 250 |
| | Ultraviolet absorber*3 | 0.5 | 1.0 | 2.0 | 3.0 | 4.0 | 5.0 | 6.5 | — |
| Photosensitive resin composition | A-1*4 | 57 | 57 | 57 | 57 | 57 | 57 | 57 | 57 |
| | FA-321M*5 | 28 | 28 | 28 | 28 | 28 | 28 | 28 | 28 |
| | FA-024M*6 | 5 | 5 | 5 | 5 | 5 | 5 | 5 | 5 |
| | BPE-200*7 | 10 | 10 | 10 | 10 | 10 | 10 | 10 | 10 |
| | B-CIM*8 | 2.9 | 2.9 | 2.9 | 2.9 | 2.9 | 2.9 | 2.9 | 2.9 |
| | EAB*9 | 0.1 | 0.1 | 0.1 | 0.1 | 0.1 | 0.1 | 0.1 | 0.1 |
| | TBC*10 | 0.02 | 0.02 | 0.02 | 0.02 | 0.02 | 0.02 | 0.02 | 0.02 |
| | Leuco crystal violet | 0.3 | 0.3 | 0.3 | 0.3 | 0.3 | 0.3 | 0.3 | 0.3 |
| | Malachite green | 0.05 | 0.05 | 0.05 | 0.05 | 0.05 | 0.05 | 0.05 | 0.05 |
| | Methanol | 10 | 10 | 10 | 10 | 10 | 10 | 10 | 10 |
| | Toluene | 10 | 10 | 10 | 10 | 10 | 10 | 10 | 10 |
| | Acetone | 10 | 10 | 10 | 10 | 10 | 10 | 10 | 10 |

The details of the respective components in Table 1 are as follows.

(Water-Soluble Resin)

*1: Polyvinyl alcohol PVA-205 (product name, manufactured by Kuraray Co., Ltd, degree of saponification=87 mol %)

*2: polyvinyl pyrrolidone K-30 (product name, manufactured by Nippon Shokubai Co., Ltd.)

(Ultraviolet Absorber)

*3: 2-Hydroxy-4-methoxybenzophenone-5-sulfonic acid hydrate (Tokyo Chemical Industry Co., Ltd.: a compound represented by formula (1))

(A) Component: Binder Polymer

*4: (A-1) (binder polymer (A-1) obtained in Synthetic Example 1) methacrylic acid/methyl methacrylate/benzylmethacrylate/styrene=25/5/25/45 (mass ratio), weight average molecular weight=50000, solid content=50 mass %, methyl cellosolve/toluene=3/2 (mass ratio) solution (B) Component: Photopolymerization Compound Having an Ethylenic Unsaturated Bond

*5: FA-321M (product name, manufactured by Hitachi Chemical Company, Ltd.) 2,2-bis(4-(methacryloxypentaethoxy)phenyl)propane

*6: FA-024M (product name, manufactured by Hitachi Chemical Company, Ltd.)
EOPO-modified dimethacrylate

*7: BPE-200 (product name, manufactured by Shin-Nakamura Chemical Co., Ltd.)
2,2-bis(4-(methacryloxydiethoxy)phenyl)propane (C) Component: Photopolymerization Initiator

*8: B-CIM (product name, manufactured by Hodogaya Chemical Co., Ltd.)
2,2'-bis(2-chlorophenyl)-4,4',5,5'-tetraphenylbiimidazole (D) Component: Photosensitization Agent

*9: EAB (product name, manufactured by Hodogaya Chemical Co., Ltd.)
4,4'-bis(diethylamino)benzophenone (E) Component: Polymerization Inhibitor

*10: TBC (manufactured by DIC Corporation)
4-tert-butylcatechol

Examples 1 to 7 and Comparative Examples 1

<Preparation of Photosensitive Element>

As a support film of a photosensitive element, PET films shown in Table 1 were provided.

Details of the PET films shown in Table 1 are as follows.

FB-40: Biaxially orientated PET film with a 3-layer structure having lubricant layers on both sides (product name, manufactured by Toray Industries, Inc., thickness: 16 μm)

(Preparation of Barrier Layer)

Next, a resin composition for forming a barrier layer was coated on a PET film (support film) in such a way that the thickness became uniform, and dried with a hot air convection drier at 95° C. for 10 min. to form a barrier layer with a dried thickness of 5 μm. In this regard, when there was a difference in the concentration of the lubricant between the two faces of the PET film, the barrier layer was formed on the PET film face with less lubricant.

(Preparation of Photosensitive Layer)

Next, a photosensitive resin composition was coated on the barrier layer of the support film in such a way that the thickness became uniform, and dried with a hot air convection drier at 100° C. for 10 min to form a photosensitive layer with a dried thickness of 15 μm.

Next, a polyethylene-made protective film (protective layer) (product name "NF-15" manufactured by Tamapoly Co., Ltd.) was bonded on the photosensitive layer to yield a photosensitive element, in which a PET film (support film), a barrier layer, a photosensitive layer, and a protective layer were laminated in this order.

<Preparation of Laminated Body>

The Cu surfaces of a copper-clad laminate (a substrate, product name "MCL-E-67", manufactured by Hitachi Chemical Co., Ltd.), which is a glass epoxy material with 12 μm-thick copper foils laminated on both surfaces, were subjected to an acid treatment, washed with water, and then dried with air flow. The copper-clad laminate was heated to 80° C., and each of the above-mentioned photosensitive elements was pressure-bonded to the copper-clad laminate so that the photosensitive layer was contacted with the copper surface while the protective layer being peeled off. The pressure bonding was performed using a heat roll at 110° C., a pressure of 0.40 MPa, and a roll speed of 1.0 m/min. Thus, a laminated body in which a substrate, a photosensitive layer, a barrier layer, and a support film were stacked in this order was obtained. These laminated bodies were used as test pieces in the tests shown below. HLM-3000 (product name, manufactured by Taisei Laminator Co., Ltd.) was used as a laminator.

<Evaluation of Photosensitivity>

A Hitachi 41-step tablet was placed on a support film of the test piece and a photosensitive layer was exposed through a support film and a barrier layer using a projecting exposing apparatus having a high pressure mercury lamp with a wavelength of 365 nm (product name UX-2240SM-XJO1 manufactured by Ushio, Inc.) to an exposure value (irradiation energy amount) at which the number of remaining steps after development in the Hitachi 41-step tablet became 11 steps. The photosensitivity was rated based on this exposure value. A lower exposure value means a higher photosensitivity.

<Evaluation of Resolution>

In order to examine the resolution, a Hitachi 41-step tablet was placed on a support film of the test piece, and a glass mask pattern having a wiring pattern of line width/space width z/z (unit: μm, wherein z changes at 1 μm intervals from 2 to 20 μm) was projected as a pattern for evaluating resolution, and a photosensitive layer was exposed through a support film and a barrier layer using a projecting exposing apparatus having a high pressure mercury lamp with a wavelength of 365 nm (product name UX-2240SM-XJO1 manufactured by Ushio, Inc.) to an irradiation energy amount at which the number of remaining steps after development in the Hitachi 41-step tablet became 11 steps. After the exposure, the test piece was washed with water at room temperature to remove the support film and the barrier layer. Next, the photosensitive layer was subjected to spray development with a 1 mass % sodium carbonate aqueous solution at 30° C. for a time duration twice as long as the shortest development time to remove unexposed parts. In this regard, the shortest development time was determined by measuring the time duration in which unexposed parts were completely removed by the above development treatment. Among the space widths between the line portions (exposed portions) in which the unexposed portion was clearly removed by the development processing, the smallest value (unit: μm) was defined as an index of resolution evaluation. It is meant that the lower this value is, the better the resolution is. The results are shown in the following Table 2.

<Evaluation of Resist Pattern Shape>

The cross-sectional shape of the resist pattern having a line width/space width of 10/10 (μm/μm) on a substrate evaluated by the above evaluation of resolution was observed with a scanning electron microscope (SEM). The cross-sectional shape of a resist pattern is shown in the following Table 2 as the evaluation of resist pattern shape. The cross-sectional shape of a resist pattern is preferably rectangular.

TABLE 2

| Evaluation item | Example 1 | Example 2 | Example 3 | Example 4 | Example 5 | Example 6 | Example 7 | Comparative Example 1 |
|---|---|---|---|---|---|---|---|---|
| Exposure value (ST = 11/41, mJ/cm$^2$) | 150 | 160 | 180 | 200 | 230 | 300 | 500 | 140 |
| Resolution (μm) | 6 | 6 | 5 | 5 | 5 | 5 | 5 | 7 |
| Resist pattern shape | Rectangular | Rectangular | Rectangular | Rectangular | Rectangular | Trapezoidal | Trapezoidal | Rectangular |

When exposure was carried out using a projecting exposing apparatus with high resolution under a condition of a low energy amount leading to the number of remaining steps of 11, the resolution was improved in Examples 1 to 7 compared to Comparative Example 1. Meanwhile, it was confirmed that in Examples 6 and 7, the amount of an ultraviolet absorber added was greater than in the other examples, and the resist pattern shape was slightly inferior. However, the resolution was good in Examples 6 and 7.

Example 8

A photosensitive element in which a PET film (support film), a barrier layer, a photosensitive layer, and a protective layer were stacked in this order, and a laminated body in which a substrate, a photosensitive layer, a barrier layer, and a support film were stacked in this order were obtained in the same manner as in Example 1 except that in the composition of the resin composition for forming a barrier layer of Example 1 shown in Table 1, the amount of ultraviolet absorber blended was increased four-fold (2.0 parts by mass), and the thickness of the barrier layer after drying was changed to 1 μm.

With respect to the obtained laminated body the photosensitivity, the resolution, and the resist pattern shape were evaluated in the same manner as in Example 1 to obtain the results that the photosensitivity and the resolution were equivalent to Example 1, and the resist pattern shape was rectangular. However, in the formed resist pattern migration of the barrier layer was recognized. More specifically, unevenness caused by migration of the barrier layer (undissolved residue of the barrier layer) was formed on the surface of the resist pattern. Although it is preferable that the concentration of an ultraviolet absorber is increased from the viewpoint of improving the resolution by making the barrier layer as thin as possible, it is obvious from the above that, when the thickness of the barrier layer is decreased, and the concentration of an ultraviolet absorber is increased, migration of the barrier layer (undissolved residue of the barrier layer) tends to occur in the development step shown in FIG. 2(d).

INDUSTRIAL APPLICABILITY

As described above, according to the present disclosure, a photosensitive element, a resin composition for forming a barrier layer, a method for forming a resist pattern, and a method for producing a printed wiring board that can reduce the sensitivity, and improve the resolution without increasing the amount of a polymerization inhibitor may be provided.

REFERENCE SIGNS LIST

1 . . . photosensitive element, 2 . . . support film, 3, 20 . . . barrier layer, 4, 30 . . . photosensitive layer, 5 . . . protective layer, 32 . . . resist pattern, 40 . . . conductive layer, 42 . . . conductive layer after etching, 50 . . . insulating layer, 60 . . . plated layer, 62 . . . plated layer after etching, 70 . . . conductive pattern, 80 . . . active light beams.

The invention claimed is:

1. A photosensitive element comprising:
a support film,
a barrier layer, and
a photosensitive layer in this order,
wherein the barrier layer contains a water-soluble resin, and an ultraviolet absorber,
wherein the ultraviolet absorber contains a compound represented by the following formula (1):

[Chemical Formula 1]

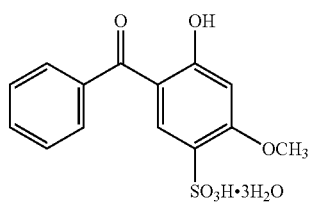

(1)

and wherein the content of the ultraviolet absorber in the barrier layer is from 0.01% to 4.0% by mass based on the total amount of the barrier layer.

2. The photosensitive element according to claim 1, wherein the solubility of the ultraviolet absorber in water at 20° C. is 0.1 g/100 mL-H$_2$O or more.

3. The photosensitive element according to claim 1, wherein the ultraviolet absorptance of the barrier layer is from 5 to 95%.

4. The photosensitive element according to claim 1, wherein the water-soluble resin contains polyvinyl alcohol.

5. The photosensitive element according to claim 1, wherein the support film is a polyester film.

6. The photosensitive element according to claim 1, wherein the thickness of the barrier layer is from 2 to 12 μm.

7. The photosensitive element according to claim 1, wherein the photosensitive layer comprises a binder polymer, a photopolymerizable compound, and a photopolymerization initiator.

8. The photosensitive element according to claim 7, wherein the content of the photopolymerization initiator in the photosensitive layer is 0.01 to 30 parts by mass relative to the total amount of 100 parts by mass of solid contents in the binder polymer and the photopolymerizable compound.

9. The photosensitive element according to claim 8, wherein the photosensitive layer further comprises a polymerization inhibitor, and the content of the polymerization inhibitor is 0.001 to 0.3 parts by mass relative to 100 parts by mass of the solid content in the binder polymer.

10. The photosensitive element according to claim 7, wherein the photosensitive layer further comprises a polymerization inhibitor, and the content of the polymerization inhibitor is 0.001 to 0.3 parts by mass relative to 100 parts by mass of the solid content in the binder polymer.

11. The photosensitive element according to claim 7, wherein the photosensitive layer further does not contain a polymerization inhibitor.

12. A method for forming a resist pattern, comprising:
a step of disposing a photosensitive layer, a barrier layer, and a support film on a substrate in this order from the substrate side using the photosensitive element according to claim 1;
a step of removing the support film and exposing the photosensitive layer to active light beams through the barrier layer; and
a step of removing the uncured portions of the photosensitive layer and the barrier layer from the substrate.

13. A method for producing a printed wiring board, comprising:
a step of forming a conductive pattern by subjecting a substrate to etching or plating, the substrate having a resist pattern formed by the method for forming a resist pattern according to claim 12.

* * * * *